US009810808B2

(12) United States Patent
Tateishi

(10) Patent No.: US 9,810,808 B2
(45) Date of Patent: Nov. 7, 2017

(54) OSCILLATION DEVICE AND MEASUREMENT APPARATUS USING THE SAME

(71) Applicant: CANON KABUSHIKI KAISHA, Tokyo (JP)

(72) Inventor: Yoshinori Tateishi, Naka-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/296,670

(22) Filed: Oct. 18, 2016

(65) Prior Publication Data

US 2017/0108613 A1    Apr. 20, 2017

(30) Foreign Application Priority Data

Oct. 20, 2015 (JP) .................................. 2015-206695

(51) Int. Cl.
  *G01J 5/02* (2006.01)
  *G01V 8/00* (2006.01)
  *H01S 1/02* (2006.01)
(52) U.S. Cl.
  CPC ............... *G01V 8/005* (2013.01); *H01S 1/02* (2013.01)
(58) Field of Classification Search
  CPC ................................... H01Q 1/38; H01Q 1/36
  See application file for complete search history.

(56) References Cited

U.S. PATENT DOCUMENTS

| 2010/0033709 | A1* | 2/2010 | Lampin .................... H01Q 1/38 356/51 |
| 2012/0134380 | A1 | 5/2012 | Edamura |
| 2013/0063159 | A1* | 3/2013 | Koyama .............. G02B 6/1226 324/639 |
| 2016/0006215 | A1 | 1/2016 | Koyama |

OTHER PUBLICATIONS

Balasekaran et al., "Patch antenna coupled 0.2 THz TUNNETT oscillators," 2010, Solid-State Electronics, vol. 54, pp. 1578-1581.*

* cited by examiner

*Primary Examiner* — Kiho Kim
(74) *Attorney, Agent, or Firm* — Canon USA, Inc., IP Division

(57) ABSTRACT

An oscillation device includes a waveguide structure including a first conductor layer, a second conductor layer, and a semiconductor layer disposed between the first conductor layer and the second conductor layer and having a gain of an electromagnetic wave, an antenna unit configured to radiate the electromagnetic wave, a first connecting portion configured to connect the waveguide structure and the antenna unit, and a second connecting portion configured to connect the waveguide structure and the antenna unit. A first connecting position of the first connecting portion and the waveguide structure and a second connecting position of the second connecting portion and the waveguide structure are different from each other in a resonance direction in which the electromagnetic wave that resonates the waveguide structure resonates.

20 Claims, 7 Drawing Sheets

OSCILLATION DEVICE AND MEASUREMENT APPARATUS USING THE SAME

BACKGROUND OF THE INVENTION

Field of the Invention

Aspects of the present invention relate to an oscillation device and a measurement apparatus using the same.

Description of the Related Art

A terahertz wave is an electromagnetic wave in a frequency range from a millimeter wave band to a terahertz band (30 GHz to 30 THz). Regarding many organic molecules of biomaterials, medical supplies, electronic industry materials, and the like, absorption peaks due to a structure or a state exist in the frequency range of the terahertz wave. The terahertz wave passes well through materials, such as paper, ceramic, resin and cloth. An imaging technique and a sensing technique utilizing the property of the terahertz wave are being researched and developed recently.

For example, these techniques are expected to be applied to a safe fluoroscopic inspection apparatus that replaces an X-ray apparatus, and to an in-line nondestructive inspection apparatus in a manufacturing process.

An exemplary oscillation device that oscillates the terahertz wave includes a current injection type oscillation device using an electromagnetic gain based on transition of electrons between subbands in a semiconductor quantum well structure. A quantum cascade laser (QCL) in a terahertz wave band in which a double-side metal waveguide (DMW) known as a low-loss waveguide structure is integrated as a resonator or, a resonant tunneling diode (RTD) is proposed. Such an oscillation device has a waveguide structure in which metals are disposed upper and lower sides of an about 10 μm thick gain medium of a semiconductor film. The oscillation device guides a terahertz wave generated by stimulated emission to the waveguide structure in a surface plasmon mode to cause resonance. With this configuration, laser oscillation near 3 THz is achieved by high optical confinement and low-loss propagation.

As a method of extracting an electromagnetic wave from a waveguide structure, U.S. Patent Application No. 2012/0134380 proposes a method of disposing a low reflective film on an end surface of the waveguide structure to improve extraction efficiency. U.S. Patent Application No. 2016/0006215 discloses a structure in which a patch antenna is provided on an end surface of a waveguide structure which has a RTD in an active layer.

SUMMARY OF THE INVENTION

According to an aspect of the present invention, an oscillation device includes a waveguide structure including a first conductor layer, a second conductor layer, and a semiconductor layer disposed between the first conductor layer and the second conductor layer and having a gain of an electromagnetic wave, an antenna unit configured to radiate the electromagnetic wave, a first connecting portion configured to connect the waveguide structure and the antenna unit, and a second connecting portion configured to connect the waveguide structure and the antenna unit. A first connecting position of the first connecting portion and the waveguide structure and a second connecting position of the second connecting portion and the waveguide structure are different from each other in a resonance direction in which the electromagnetic wave that resonates the waveguide structure resonates.

Further features of aspects of the present invention will become apparent from the following description of exemplary embodiments with reference to the attached drawings.

DESCRIPTION OF THE EMBODIMENTS

In the structures described in U.S. Patent Application Nos. 2012/0134380 and 2016/0006215, an electromagnetic wave generated at a position distant from a structure at which the electromagnetic wave is extracted cannot be extracted in a waveguide having the waveguide loss larger than the loss caused by end surface reflection, and utilization efficiency of the generated electromagnetic wave can be lowered.

Aspects of the present invention improve utilization efficiency of an electromagnetic wave in an oscillation device provided with a waveguide as compared with the related art.

First Embodiment

Figure 1:
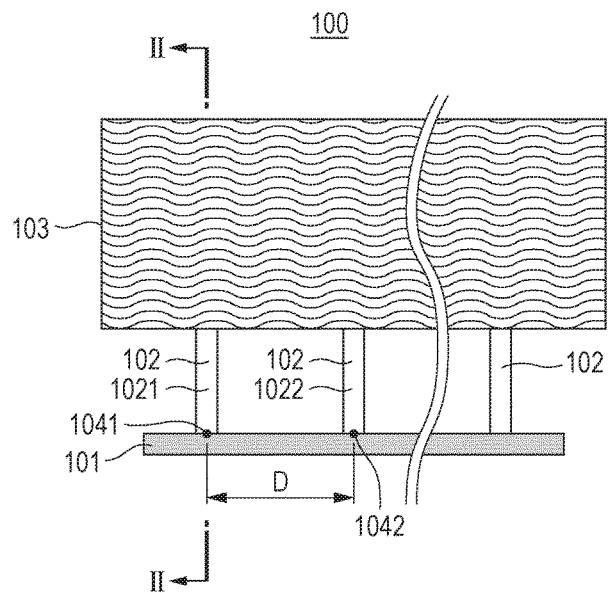
FIG. 1 is a top view illustrating a configuration of an oscillation device of a first embodiment.
Figure 2:
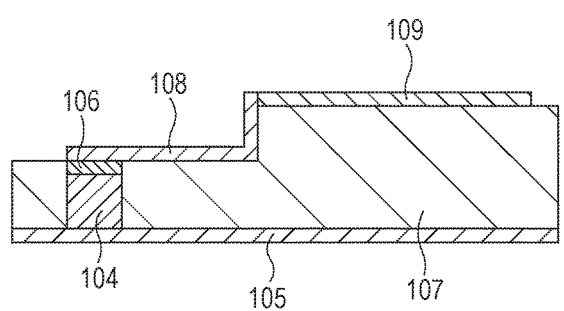
FIG. 2 is a cross-sectional view illustrating a configuration of the oscillation device of the first embodiment.

An oscillation device 100 (hereafter, referred to as "device 100") of the present embodiment is described with reference to FIGS. 1 and 2. FIG. 1 is a top view illustrating an exterior of the device 100 and FIG. 2 is a cross-sectional view of the device 100 along line II-II.

The device 100 includes a resonance portion (a waveguide structure) 101, a plurality of impedance matching portions (connecting portions) 102 (hereafter, referred to as "matching portions 102"), and an antenna 103. The resonance portion 101 and the antenna 103 are connected via a plurality of matching portions 102. Each of the matching portions 102 is connected to the resonance portion 101 at different positions in a resonance direction.

The "resonance direction" here is the direction in which the electromagnetic wave that resonates the resonance portion 101 resonates, and is the direction in which the electromagnetic wave propagates in the waveguide structure of the resonance portion 101. More particularly, the "resonance direction" is expressed by a line which connects centers of gravity of the cross sections perpendicular to the propagating direction of the electromagnetic wave which propagates (resonates) in the waveguide structure in each of a plurality of positions of the waveguide structure.

The resonance portion 101 is a waveguide structure which generates a terahertz wave and is resonated by the generated terahertz wave. The resonance portion 101 includes a gain structure (a semiconductor layer) 104, a first conductor layer 105, and a second conductor layer 106. The gain structure 104 is disposed between the first conductor layer 105 and the second conductor layer 106 in contact with thereto. The first conductor layer 105 is a common ground conductor of the gain structure 104, the plurality of matching portions 102, and the antenna 103. The resonance portion 101 of the present embodiment is a linear waveguide structure.

The gain structure 104 includes a semiconductor multilayer film which generates a terahertz wave, and is a semiconductor layer which has a gain in a frequency range of the terahertz wave. The gain structure 104 includes a resonant tunneling diode (RTD) or a Gunn diode having negative resistance, for example. The gain structure 104 of the present embodiment uses the RTD. The gain structure 104 becomes an electromagnetic gain when applied a bias voltage between the first conductor layer 105 and the second conductor layer 106 from an external power supply, and generates negative resistance.

Each of the first conductor layer 105 and the second conductor layer 106 is constituted by a material of which real part of dielectric constant includes a negative dielectric constant medium. Any of metal (e.g., Ti, Mo, W, Ag, Au, Cu, Al and AuIn alloy), semimetal (e.g., Bi, Sb, ITO and ErAs), highly doped semiconductor, and the like may be suitably used as the first conductor layer 105 and the second conductor layer 106. Alternatively, a laminated product of the above-described metal, semimetal, highly doped semiconductor, and the like may be used as the first conductor layer 105 and the second conductor layer 106.

The waveguide structure of the resonance portion 101 of the present embodiment is a double-sided metal waveguide (DMW) in which a core layer is disposed between two clad layers. The two clad layers are a laminated film of the first conductor layer 105 and a highly doped semiconductor layer included in the gain structure 104 and a laminated film of the second conductor layer 106 and a highly doped semiconductor layer included in the gain structure 104. The core layer is a RTD included in the gain structure 104.

Therefore, assuming that an oscillation wavelength defined by the resonance portion 101 is $\lambda_g$, a distance between the first conductor layer 105 and the second conductor layer 106 is as short as less than or equal to $\lambda_g/2$. In one embodiment the distance between the first conductor layer 105 and the second conductor layer 106 is as short as less than or equal to about $\lambda_g/10$. The electromagnetic wave in the frequency range of the terahertz wave becomes a standing wave in the resonance portion 101. As is known in the semiconductor laser technique, the oscillation wavelength $\lambda_g$ is defined by setting a length L of the resonance portion 101 in the longitudinal direction which is the resonance direction of the electromagnetic wave to be an integer multiple of $\lambda_g/2$.

Each of a plurality of matching portions 102 is a connecting portion at which the resonance portion 101 and the antenna 103 are connected. Each of a plurality of matching portions 102 is an impedance matching circuit for conducting impedance matching between the resonance portion 101 and the antenna 103. The matching portion 102 of the present embodiment has a microstrip line (MSL) structure in which the first conductor layer 105, a dielectric layer 107 and a third conductor layer 108 are laminated in this order. Each of the matching portions 102 is connected to the resonance portion 101 at different positions in the resonance direction. In one embodiment, the matching portion 102 is connected to the resonance portion 101 by the third conductor layer 108 in contact with the second conductor layer 106.

The electromagnetic wave generated from the gain structure is lost while propagating in the waveguide structure. Loss of the electromagnetic wave in the waveguide structure becomes larger as a distance in which the electromagnetic wave propagates in the waveguide structure becomes longer. In the related art oscillation device, since the electromagnetic wave is extracted from one end of the resonance portion, loss of the electromagnetic wave generated near the other end of the resonance portion is large. In the device 100 of the present embodiment, on the contrary, by disposing the matching portions 102 which connect the resonance portion 101 and the antenna 103 at a plurality of different positions in the resonance direction of the resonance portion 101, a distance in which the electromagnetic wave generated at each position of the resonance portion 101 propagates inside the waveguide is shortened. Therefore, loss of the electromagnetic wave in the waveguide structure can be reduced as compared with the related art and utilization efficiency of the electromagnetic wave can be improved.

Here, two adjoining matching portions 102 among a plurality of matching portions 102 are referred to as a first matching portion 1021 and a second matching portion 1022. If a phase of the electromagnetic wave extracted from a connecting position of the first matching portion 1021 and the resonance portion 101 and a phase of the electromagnetic wave extracted from the connecting position of the second matching portion 1022 and the resonance portion 101 are opposite, the electromagnetic waves cancel each other in the antenna 103.

In one embodiment, the phases of the electromagnetic waves extracted from the matching portions 1021 and 1022 are close to the same. That is, the distance D between a first connecting position 1041 of the first matching portion 1021 and the resonance portion 101 and a second connecting position 1042 of the second matching portion 1022 and the resonance portion 101 in the resonance direction is close to $n\lambda_g$. That is, in the device 100 provided with a plurality of matching portions 102, the distance between the connecting positions of each of a plurality of matching portions 102 and the resonance portion 101 in the resonance direction is set close to $n\lambda_g$.

If the distance between the connecting positions in the resonance direction is $n\lambda_g$, utilization efficiency of the electromagnetic wave becomes the maximum. However, the distance is not limited to the same and that the distance between the connecting positions in the resonance direction is longer than $n\lambda_g-\lambda_g/4$ and shorter than $n\lambda_g+\lambda_g/4$. If the distance between the connecting positions in the resonance direction is longer than $n\lambda_g-\lambda_g/4$ and shorter than $n\lambda_g+\lambda_g/4$, a phase difference between the phase of the electromagnetic wave extracted from the first matching portion 102 and the phase of the electromagnetic wave extracted from the second matching portion becomes less than $\pi C/2$. Therefore, the oscillation device 100 has improved utilization efficiency of the electromagnetic wave as compared with an oscillation device 300 provided with only a single matching portion. The "connecting position of the resonance portion 101 and the matching portion 102" designates the center of gravity of the cross section of the matching portion 102 at a position at which the matching portion 102 and the resonance portion 101 are connected.

In one embodiment, each of a plurality of matching portions 102 is disposed in a manner such that positions that become nodes of an electric field of the electromagnetic wave which resonates in the resonance portion 101 in the resonance direction are not included on a plane on which the matching portion 102 and the resonance portion 101 are connected. With this configuration, the electromagnetic wave may be extracted efficiently from the matching portions 102.

An impedance of the antenna 103 when viewed from the connecting position of the antenna 103 and the matching portion 102 is equal to or greater than 100Ω, which is higher than the impedance of the resonance portion 101. Therefore, if impedance matching is conducted between the resonance portion 101 and the antenna 103, the impedance matching is conducted easily when the impedance of the connecting position of the resonance portion 101 and matching portion 102 is close to the impedance of the antenna 103 when viewed from the connecting position of the antenna 103 and the matching portion 102. In order to make the impedance of the connecting position of the resonance portion 101 and the matching portion 102 high, the matching portions 102 are disposed at positions other than positions that become nodes of an electric field of the electromagnetic wave which resonates in the resonance portion 101 in the resonance direction so that the positions that become the nodes of the electric field of the electromagnetic wave which resonates in the resonance portion 101 in the resonance direction are not included on the plane on which the matching portions 102 and the resonance portion 101 are connected.

For example, each of a plurality of matching portions 102 is connected to the resonance portion 101 at a point at which the electric field of the electromagnetic wave which resonates in the resonance portion 101 becomes the maximum, i.e., at a portion which becomes an antinode of the electric field (an antinode of a standing wave which stands in the resonance portion 101). In the present embodiment, since an end surface of the resonance portion 101 is an open end, a position of $n\lambda_g/2$ (n is a natural number) from the end surface of the resonance portion 101 toward the resonance direction of the electromagnetic wave (a position of $\lambda_g/4 + n\lambda_g/2$, if the end surface of the resonance portion 101 is a fixed end) becomes an antinode of the electric field. In the present embodiment, the resonance portion 101 and the MSLs which are the impedance matching portions 102 are connected at a plurality of connecting portions of $\lambda_g/2$, $3\lambda_g/2$, $5\lambda_g/2$, ... in the resonance direction from the end surface of the resonance portion 101.

The antenna 103 is an antenna unit which radiates an electromagnetic wave to a space. The antenna unit of the present embodiment is constituted by a single antenna 103. The antenna 103 includes the first conductor layer 105, the dielectric layer 107 and a fourth conductor layer 109. The dielectric layer 107 is disposed between the first conductor layer 105 and the fourth conductor layer 109.

The resonance portion 101 and the antenna 103 are connected via a plurality of matching portions 102. Impedance matching between the resonance portion 101 and the antenna 103 is important in effectively using the electromagnetic wave which resonates in the resonance portion 101. Impedance matching is described below.

If the resonance portion 101 and the antenna 103 satisfy the relationship of Expression (1), an impedance Zwg of the resonance portion 101 and an impedance Zant of the antenna 103 are matched and the electromagnetic wave can be extracted from the resonance portion 101 efficiently. The impedance Zwg of the resonance portion 101 is an impedance when viewed the resonance portion 101 from the connecting position of the resonance portion 101 and the matching portion 102. The impedance Zant of the antenna 103 is an impedance when viewed the antenna 103 from the connecting position of the matching portion 102 and the antenna 103. Here, assume that the length of the MSL (the matching portion 102) is ¼ of an effective wavelength of the electromagnetic wave ($\lambda_g/4$) and that the characteristic impedance thereof is $Z_0$. Since the MSL of the resonance portion 101 and the MSL of the matching portion 102 have different refractive indices, the length of the matching portion 102 is determined by the effective wavelength in consideration of the refractive index.

$$Z_0^2 = Zwg \cdot Zant \qquad (1)$$

Extraction efficiency of the electromagnetic wave generated in the resonance portion 101 can be improved by connecting the resonance portion 101 and the antenna 103 using a plurality of matching portions 102. FIG. 4 illustrates simulation results of radiation efficiency of the related art oscillation device and the device 100 of the present embodiment. Simulation is conducted about the related art oscillation device 300 provided with a single matching portion 102 illustrated in FIG. 3A and an oscillation device 350 provided with two matching portions 102 as an exemplary oscillation device of the present embodiment illustrated in FIG. 3B.

Since a resonance portion 301 of the oscillation device 300 is $2\lambda_g$ in length and the standing wave of the electromagnetic wave which resonates in the resonance portion 301 reflects on the open end, the MSL as a matching portion 302 is connected to the position of $\lambda_g/2$ toward the resonance direction of the electromagnetic wave from the end surface of the resonance portion 301. The configurations of the matching portion 302 and the resonance portion 301 are the same as those of the matching portion 102 and the resonance portion 101. Also in the element 350, the resonance portion 101 is $2\lambda_g$ in length and the standing wave of the electromagnetic wave which resonates in the resonance portion 101 reflects on the open end. The MSLs as the matching portions 102 are connected at two different positions of $\lambda_g/2$ and $3\lambda_g/2$ toward the resonance direction of the electromagnetic wave from the end surface of the resonance portion 101. The oscillation device 350 and the oscillation device 300 here are the same in film structures constituting each of the resonance portions 101 and 301, in shape of the matching portions 102 and 302, and the like. Each of the antennas 103 and 303 are patch antennas of which radiation efficiency becomes substantially the maximum in each structure.

Figure 3A:
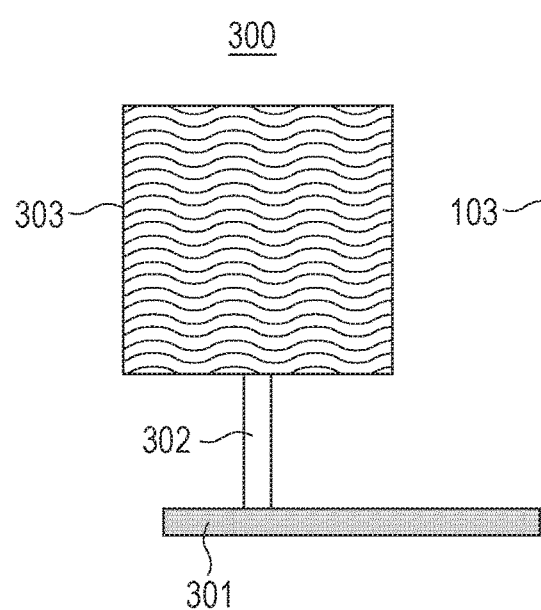
FIGS. 3A and 3B are top views illustrating a configuration of the oscillation device used in simulation.
Figure 3B:
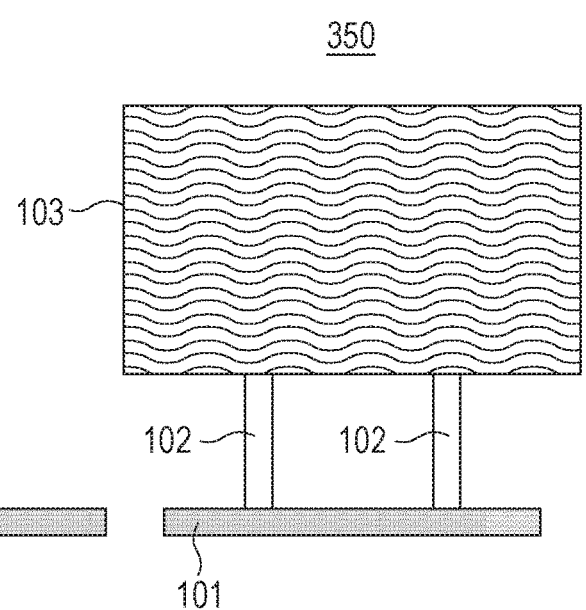
Figure 4:
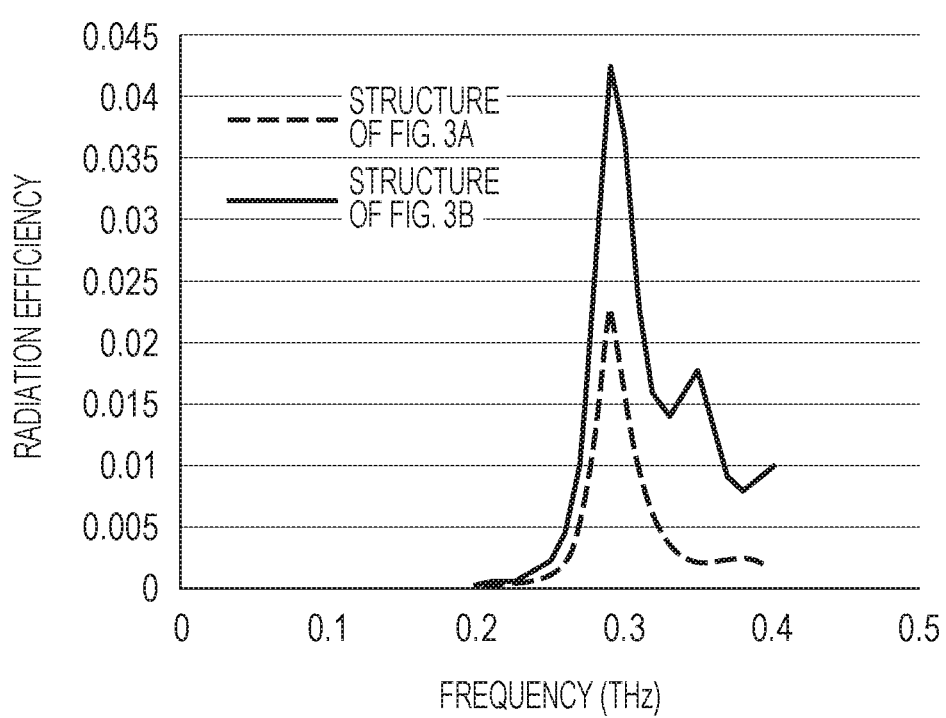
FIG. 4 illustrates simulation results of maximum radiation efficiency of oscillation devices.

FIG. 4 illustrates the calculation results of radiation efficiency in the structures of FIGS. 3A and 3B calculated by an electromagnetic field simulator. The maximum value of the radiation efficiency of the oscillation device 350 in which two matching portions 102 are connected at different positions in the resonance direction of the resonance portion 101 is about twice the maximum value of the radiation efficiency of the oscillation device 300 in which the matching portion 302 is connected at a single position of the resonance portion 301. As described above, the oscillation device 350 has an improved output of the electromagnetic wave than that of the related art oscillation device 300.

Thus, according to the device 100, utilization efficiency of the electromagnetic wave can be improved as compared with the related art by extracting the electromagnetic wave which resonates in the resonance portion 101 from a plurality of different positions in the resonance direction of the resonance portion 101 using a plurality of matching portions 102.

Considering a case where the electromagnetic wave is extracted from the end surface of the resonance portion using a DMW, since the number of the end surface cannot be increased, there is a limit on the adjustment of the reflection loss on the end surface which also is extraction load. The extraction load is adjustable as in the device 100 by extracting the electromagnetic wave from a plurality of different positions in the resonance direction of the resonance portion 101. As is widely known in the general laser technique, oscillation output power of the device 100 can be increased easily by, for example, increasing the length of the waveguide structure to relatively lower the reflection loss on the end surface.

The device 100 may efficiently extract the electromagnetic wave which resonates in the resonance portion 101 from a plurality of matching portions 102 provided in the resonance portion 101 by impedance matching, and radiate the electromagnetic wave while controlling the radiation direction to a single direction perpendicular to a substrate surface by the antenna 103.

Second Embodiment

Figure 8:
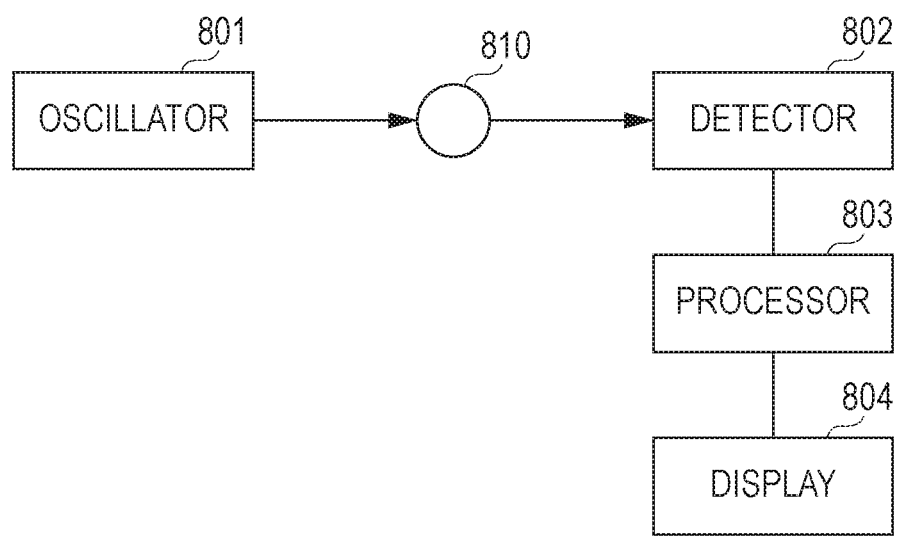
FIG. 8 is a block diagram illustrating a configuration of a measurement apparatus of a second embodiment.

In the present embodiment, a measurement apparatus 800 using a device 100 is described with reference to FIG. 8. The measurement apparatus 800 irradiates a sample 810 with a terahertz wave oscillated by the device 100 and measures the sample 810. The state and the like of the sample 810 may be acquired by the combination of the measurement apparatus 800 and a processor 803 which processes a measurement result.

The measurement apparatus 800 includes an oscillator 801, a detector 802, the processor 803, and a display 804. The oscillator 801 is an oscillating portion which oscillates a continuous wave of a terahertz wave. The device 100 is used as the oscillator 801. The terahertz wave oscillated from the oscillator 801 is illuminated to the sample 810.

The detector 802 is a detection unit which detects a terahertz wave having penetrated through the sample 810 or reflected on the sample 810. That is, the detector 802 detects a terahertz wave which has interacted with the sample 810. The detector 802 may be a Schottky barrier diode (SBD), a plasmonic detector, a bolometer, and a pyroelectric detector, for example.

The processor 803 is a computer provided with a CPU, memory, and a storage device, for example. The CPU conducts processing to acquire information about the sample 810, such as an optical property or a state of the sample 810 using a detection result of the detector 802. The display 804 is a display device or the like which displays information about the sample 810 acquired by the processor 803. The measurement apparatus 800 may be applicable to an industrial inspection apparatus which inspects medical states and the like, to an apparatus which inspects food adulteration, and the like.

As described above, the device 100 may be used as the oscillator 801 of the measurement apparatus 800. Since the device 100 which has radiation efficiency higher than that of the related art and can oscillate a high power terahertz wave is used, an S/N ratio of a measurement result by the measurement apparatus 800 is improved, and the inspection time can be shortened.

Example 1

A configuration of the device 100 is described. In Example 1, a plasmon waveguide structure is used in the resonance portion 101. In the plasmon waveguide as the resonance portion 101, a first conductor layer 105, a gain structure 104, and a second conductor layer 106 are laminated in the order.

The gain structure 104 includes a semiconductor laminated structure including a InGaAs/InAlAs-based triple barrier resonant tunneling diode (RTD) structure which generates a terahertz wave by transition between subbands. More specifically, the gain structure 104 has a semiconductor quantum well structure in which n-InGaAs (about 50 nm, Si, $2 \times 10^{18}$ cm$^{-3}$), AlAs (about 1.3 nm), InGaAs (about 7.6 nm), InAlAs (about 2.6 nm), InGaAs (about 5.6 nm), AlAs (about 1.3 nm) and n-InGaAs (about 50 nm, Si, $2 \times 10^{18}$ cm$^{-3}$) are laminated in this order as the RTD structure. A highly career doped n+InGaAs (about 200 nm, $1 \times 10^{19}$ cm$^3$) is disposed above and below the RTD structure and, this connects the first conductor layer 105 and the second conductor layer 106 to the gain structure 104 with relatively low resistance.

In Example 1, the first conductor layer 105 has a laminated film of Ti/Pd/Au/Pd/Ti (each film thickness: about 20 nm/about 20 nm/about 400 nm/about 20 nm/about 20 nm). The second conductor layer 106 has a laminated film of Ti/Pd/Au (each film thickness: about 20 nm/about 20 nm/about 400 nm). An unillustrated substrate is a p+GaAs substrate connected to the first conductor layer 105.

The resonance portion 101 had a Fabry-Perot resonator structure and is provided with at least two end surfaces in the propagating direction of the electromagnetic wave (the resonance direction). Since the electromagnetic wave resonating inside the resonance portion 101 is made to stand using reflection from the end surfaces, the length in the resonance direction is an element to determine the oscillation wavelength. In Example 1, the length of the resonance portion 101 is set to about 100 μm (=$2\lambda_g$) and the width is set to about 3 μm so that the oscillation frequency of the terahertz wave becomes 0.30 THz. A distance between the first conductor layer 105 and the second conductor layer 106 is as close as about 0.5 μm. The electromagnetic wave which resonates in the resonance portion 101 has antinodes of the electric field at both end surfaces of the resonance portion 101 which are open ends, and at positions of $\lambda_g/2$ (about 25 μm from the end surface), $\lambda_g$ (about 50 μm from the end surface) and $3\lambda_g/2$ (about 75 μm from the end surface) from one end surface of the resonance portion 101 in the resonance direction. Here, the electromagnetic wave is in the same phase at the positions of $\lambda_g/2$ and $3\lambda_g/2$ from the end surface of the resonance portion 101 in the resonance direction. Each of the matching portions 102 is connected to these positions of $\lambda_g/2$ and $3\lambda_g/2$. The resonance portion 101 and the antenna 103 (the patch antenna) are connected via the matching portions 102.

The matching portion 102 has a structure in which the first conductor layer 105, the dielectric material 107, and the third conductor layer 108 are laminated in this order. In one embodiment, the dielectric material 107 is an insulating material which has low loss in a terahertz wave band. The insulating material may be resin, such as benz-cyclo-butene (BCB) and inorganic materials, such as SiO$_2$. In Example 1, BCB is used as the dielectric material 107. A thickness of the dielectric material 107 of the matching portion 102 is set to 1.2 μm in consideration of the planarization of the plasmon waveguide structure of the resonance portion 101 and the characteristic impedance of the MSL.

Since the impedance between the resonance portion 101 and the antenna 103 is to be matched, the impedances are to be brought close to that of Expression (1). In Example 1, since Zwg is about 2Ω and Zant is about 200Ω, $Z_0$ is to be about 20Ω. Then, a line width of MSL is set to about 12 μm in order to set $Z_0$ of MSL to be about 20Ω. The length of MSL is set to $\lambda_g/4$=about 155 um. All of a plurality of matching portions 102 have the same design in order to send the electromagnetic wave of the same phase to the antenna 103.

A patch antenna is used as the antenna 103. The antenna 103 has a structure in which the first conductor layer 105, the dielectric material 107 and the fourth conductor layer 109 are laminated in this order. BCB is used as the dielectric material 107 as in the impedance matching portion 102. A radiation pattern has a main lobe in one direction perpendicular to the first conductor layer 105 (a substrate surface) of the radiating angle controlled by the antenna 103. A film thickness of the dielectric material 107 of the antenna 103 is set to about 20 μm in order to increase radiation efficiency of the antenna 103. The fourth conductor layer 109 of the antenna 103 and the third conductor layer 108 of the matching portion 102 are connected electrically.

The second conductor layer 106 of the resonance portion 101, the third conductor layer 108 of the matching portion 102, and the fourth conductor layer 109 of the antenna 103 may be formed simultaneously. Since the oscillation frequency is 0.3 THz, the size of the patch antenna of the antenna 103 is set to about 310 μm in length in the resonance direction (the length of the patch antenna) and is about 500 μm in width. A simulation is conducted about the oscillation device 350 provided with two matching portions 102 of FIG. 3B as the device 100. As a result, power is composed in the direction perpendicular to the substrate surface and about 20 μW of electromagnetic wave output of the oscillation device 350 is obtained.

According to the device 100, output of the electromagnetic wave can be increased as compared with the method of extracting the electromagnetic wave from one end surface of the resonance portion as described in U.S. Patent Application No. 2016/0006215.

If the number of the matching portions 102 is increased and the connecting positions with the resonance portion 101 are increased, output of the electromagnetic wave increases accordingly.

In Example 1, the antenna unit includes only a single antenna 103. The matching portions 102 are disposed at a plurality of different positions in the resonance direction of the resonance portion 101, and the resonance portion 101 and one antenna 103 are connected via a plurality of matching portions 102. However, this configuration is not restrictive, and the antenna unit may have a plurality of antennas and each of a plurality of matching portions 102 may be connected to the separate antenna.

Figure 5:
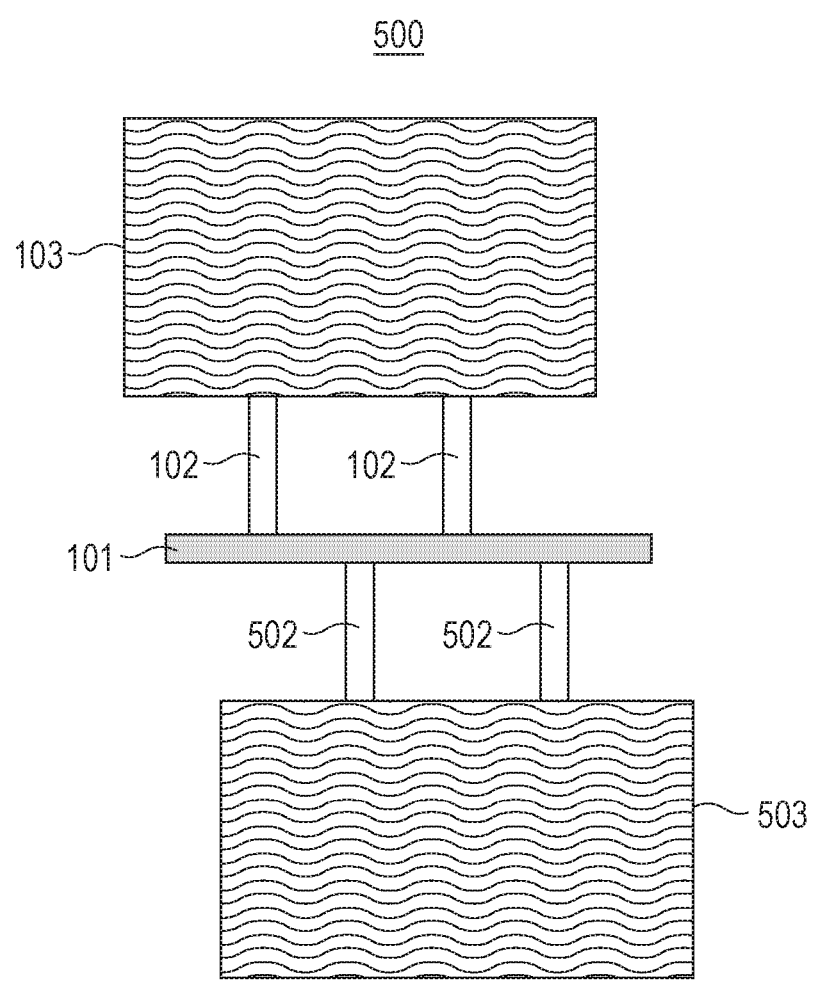
FIG. 5 is a top view illustrating a configuration of an exemplary oscillation device of Example 1.

For example, as illustrated in FIG. 5, the oscillation device 500 includes the antenna unit has the first antenna 103 and a second antenna 503. The matching portions 102 are disposed at positions of odd multiple of $\lambda_g/2$ (i.e., $\lambda_g/2$ and $3\lambda_g/2$) from the end surface of the resonance portion 101, and the resonance portion 101 and the first antenna 103 are connected via the two matching portions 102. Matching portions 502 are disposed at positions of even multiples of $\lambda_g/2$ (i.e., $\lambda_g$ and $2\lambda_g$ from the end surface of the resonance portion 101, and the resonance portion 101 and the second antenna 503 are connected via the two matching portions 502. The matching portion 502 and the matching portion 102 are the same in configuration, and the second antenna 503 and the antenna 103 are the same in configuration.

The phases of the electromagnetic waves extracted from the two matching portions 102 are the same. The phases of the electromagnetic waves extracted from the two matching portions 502 are also the same. That is, the two matching portions 102 disposed at positions which become the same phase with respect to the resonance portion 101 are connected to the same first antenna 103, and the two matching portions 502 disposed at positions which become the same phase with respect to the resonance portion 101 are connected to the same second antenna 503.

In this case, by disposing the first antenna 103 and the second antenna 503 in consideration of the resonance directions thereof, it is possible to improve directivity of the electromagnetic wave to radiate and to improve extraction efficiency of the electromagnetic wave.

The oscillation device 100 and the oscillation device 500 can improve utilization efficiency of the electromagnetic wave as compared with the related art.

Example 2

Figure 6:
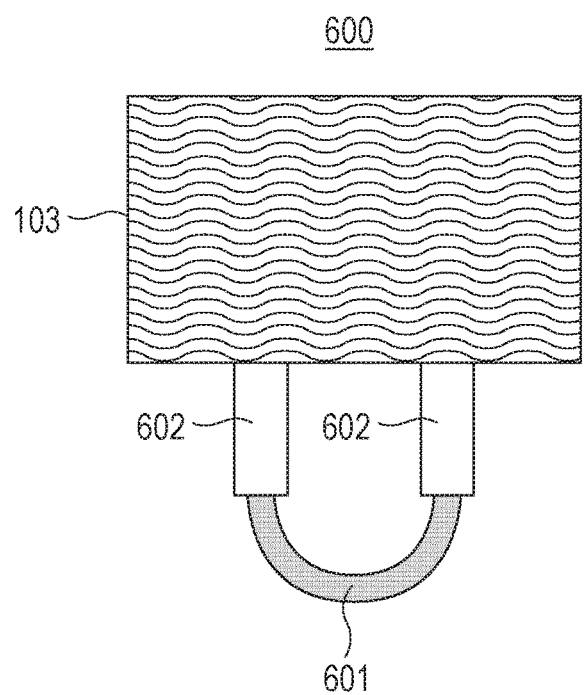
FIG. 6 is a top view illustrating a configuration of an oscillation device of Example 2.

In Example 2, another example of the device 100 is described with reference to FIG. 6. FIG. 6 is a schematic diagram illustrating a configuration of an oscillation device 600 of Example 2. Although the device 100 has a straight type waveguide structure with a linear resonance portion 101, the oscillation device 600 has a half ring-shaped resonance portion 601. Each of two end portion of the resonance portion 601 is connected to a matching portion 602. Other configurations are the same as those of Example 1 and detailed description is omitted.

The oscillation device 600 includes the resonance portion 601, the matching portions 602 and an antenna 103. The laminated structure of the cross section of the resonance portion 601, and the film structures of the matching portion 602 and the antenna 103 are the same as those of Example 1.

The resonance portion 601 has a half ring shape, and the length of resonance portion (the waveguide structure) 601 is $n\lambda_g$ (n=1, 2, 3, . . . ) (the full length of the waveguide structure in the resonance direction). The resonance portion 601 and the antenna 103 are connected via the two matching portions 602. The two matching portions 602 are connected to the two end surfaces of the resonance portion 601, respectively. Since the length of the resonance portion 601 is a natural number multiple of the resonance wavelength $\lambda_g$, the phases of the electromagnetic waves which resonate in the resonance portion 601 are the same on both the end surfaces of the half ring-shaped resonance portion 601. Therefore, the phases of the electromagnetic waves extracted from the two matching portions 602 can be the same.

Since the terahertz wave which resonates in the half ring-shaped resonance portion 601 reflects on an open end, the two matching portions 602 can be connected to positions of antinodes of an electric field of a standing wave of the terahertz wave which resonates in the resonance portion 601.

The oscillation device 600 of Example 2 improves utilization efficiency of the electromagnetic wave as compared with the related art. Therefore, according to the oscillation device 600, it is expected that about twice as high radiation efficiency as that in the method of extracting the electromagnetic wave from an end surface of a related art resonator is obtained.

Example 3

Figure 7:
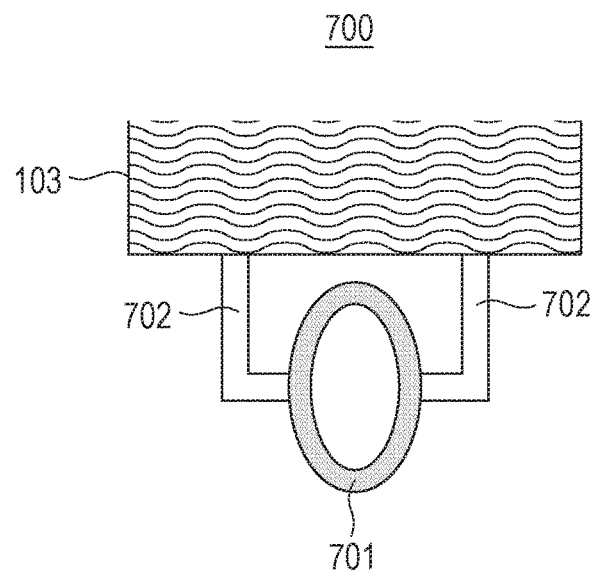
FIG. 7 is a top view illustrating a configuration of an oscillation device of Example 3.

In Example 3, another example of the device 100 is described with reference to FIG. 7. FIG. 7 is a schematic diagram illustrating a configuration of an oscillation device 700 of Example 3. The oscillation device 700 has a ring-shaped resonance portion 701, and matching portions 702 are connected at two different positions of the resonance portion 701. Other configurations are the same as those of Example 1 and detailed description is omitted.

The oscillation device 700 includes a resonance portion 701, matching portions 702, and an antenna 103. The laminated structure of the cross section of the resonance portion 701, and the film structures of the matching portion 702 and the antenna 103 are the same as those of Example 1.

The resonance portion 701 has a ring shape and the length of the resonator (the waveguide structure) 701 is $2\lambda_g + n\lambda_g$ (n=0, 1, 2, ... ). The resonance portion 701 and the antenna 103 are connected via the two matching portions 702. The two matching portions 702 are disposed so that the phases of the electromagnetic waves extracted from the matching portions 702 are the same, and a distance between connecting positions in the resonance direction becomes $n\lambda_g$ with respect to the resonance portion 701. That is, the two matching portions 702 are disposed so that the length of the resonance portion 701 between the two matching portions 702 is set to $n\lambda_g$. In one embodiment, each of the two matching portions 702 is connected to the position which becomes an antinode of an electric field of a standing wave of the terahertz wave which resonates in the resonance portion 701.

The oscillation device 700 of the present embodiment improves utilization efficiency of the electromagnetic wave as compared with the related art.

Example 4

Figure 9A:
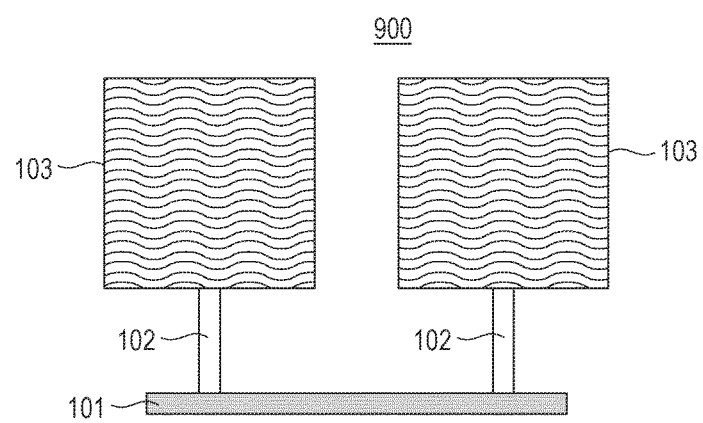
FIG. 9A is a top view illustrating a configuration of an exemplary oscillation device of Example 4.

Another example of the device 100 is described in Example 4. FIG. 9A illustrates a configuration of an oscillation device 900 as another example of the device 100. In the device 100, the antenna unit includes only a single antenna 103 and a plurality of matching portions 102 are connected to that single antenna 103. In the oscillation device 900, on the contrary, the antenna unit includes a plurality of antennas 103, and each of a plurality of matching portions 102 is connected to the separated antenna 103. Each of a plurality of matching portions 102 is disposed at a position of an antinode of an electric field of a terahertz wave which stands in the resonance portion 101.

Figure 9B:
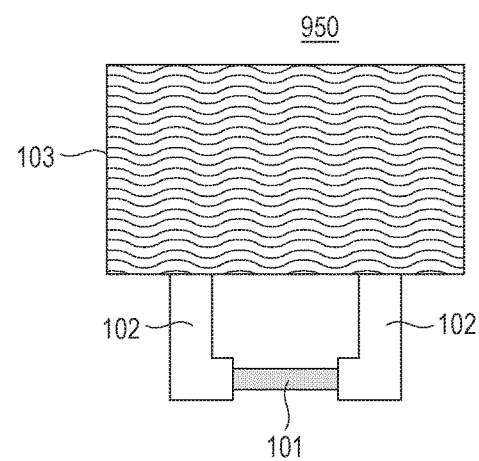
FIG. 9B is a top view illustrating a configuration of another example of an oscillation device of Example 4.

FIG. 9B illustrates a configuration of an oscillation device 950 as another example of the device 100. The oscillation device 950 is an oscillation device in which a matching portion 102 is disposed at each of both end surfaces of a linear resonance portion 101, and the resonance portion 101 and a single antenna 103 are connected via each of the matching portions 102. Since the length of the resonance portion 101 is a natural number multiple of the resonance wavelength $\lambda_g$, the phases of the electromagnetic waves which resonate in the resonance portion 101 are the same on both the end surfaces of the resonance portion 101. Therefore, the phases of the electromagnetic waves extracted from the two matching portions 102 are the same. Since the terahertz wave which resonates in the resonance portion 101 reflects on an open end, the two matching portions 102 are connected to positions of antinodes of an electric field of a standing wave of the terahertz wave which resonates in the resonance portion 101.

The oscillation devices 900 and 950 of Example 4 improve utilization efficiency of the electromagnetic wave as compared with the related art. Since the two antennas 103 are used in the oscillation device 900, the antennas 103 are to be designed in a manner such that the radial directions of the electromagnetic waves radiated from the antennas 103 are the same. In one embodiment, a plurality of matching portions 102 are connected to a single antenna 103. Also in the oscillator of these configurations, it is possible to improve directivity of the electromagnetic wave to radiate as in Examples described above and to improve extraction efficiency of the electromagnetic wave.

Embodiments and Examples of aspect of the present invention have been described above, but aspect of the present invention is not limited to the same. Various modifications and changes may be made without departing from the scope of the present invention.

For example, in the embodiments described above, the first conductor layer 105 is a common ground conductor of the gain structure 104, a plurality of matching portions 102, and the antenna 103. This configuration is not restrictive, however, and each of the gain structure 104, a plurality of matching portions 102, and the antenna 103 may be provided with a different conductor as a ground conductor.

While aspects of the present invention have been described with reference to exemplary embodiments, it is to be understood that aspects of the invention are not limited to the disclosed exemplary embodiments. The scope of the following claims is to be accorded the broadest interpretation so as to encompass all such modifications and equivalent structures and functions.

This application claims the benefit of Japanese Patent Application No. 2015-206695, filed Oct. 20, 2015, which is hereby incorporated by reference herein in its entirety.

What is claimed is:

1. An oscillation device comprising:
    a waveguide structure including a first conductor layer, a second conductor layer, and a semiconductor layer disposed between the first conductor layer and the second conductor layer and having a gain of an electromagnetic wave;
    an antenna unit configured to radiate the electromagnetic wave;
    a first connecting portion configured to connect the waveguide structure and the antenna unit; and
    a second connecting portion configured to connect the waveguide structure and the antenna unit,
    wherein a first connecting position of the first connecting portion and the waveguide structure and a second connecting position of the second connecting portion and the waveguide structure are different from each other in a resonance direction in which the electromagnetic wave that resonates the waveguide structure resonates.

2. The oscillation device according to claim 1, wherein, assuming that an oscillation wavelength of the electromagnetic wave is $\lambda_g$ and that a natural number is n, a distance between the first connecting position and the second connecting position is longer than $n\lambda_g - \lambda_g/4$ and shorter than $n\lambda_g + \lambda_g/4$.

3. The oscillation device according to claim 1, wherein
    the first connecting portion is disposed at a position not including a position which becomes a node of an electric field of the electromagnetic wave which resonates in the waveguide structure in the resonance direction on a plane on which the first connecting portion and the second conductor layer are connected, and
    the second connecting portion is disposed at a position not including a position which becomes a node of the electric field of the electromagnetic wave on which the second connecting portion and the second conductor layer are connected.

4. The oscillation device according to claim 1, wherein the first connecting position is a position which becomes an antinode of the electric field of the electromagnetic wave which resonates in the waveguide structure in the resonance direction.

5. The oscillation device according to claim 1, wherein, assuming that the oscillation wavelength of the electromagnetic wave is $\lambda_g$, each of the first connecting position and the second connecting position is located at a position of an odd multiple of $\lambda_g/2$ from an end surface of the waveguide structure in the resonance direction.

6. The oscillation device according to claim 1, wherein the second connecting position is a position which becomes an antinode of the electric field of the electromagnetic wave which resonates in the waveguide structure in the resonance direction.

7. The oscillation device according to claim 1, wherein each of the first connecting portion and the second connecting portion is a matching circuit for adjusting an impedance of the resonance portion and an impedance of the antenna.

8. The oscillation device according to claim 1, wherein each of the first connecting portion and the second connecting portion is a microstrip line which is ¼ in length of an effective wavelength of the electromagnetic wave.

9. The oscillation device according to claim 1, wherein each of the first conductor layer and the second conductor layer includes a negative permittivity medium of which real part of dielectric constant is negative.

10. The oscillation device according to claim 1, wherein the semiconductor layer includes a semiconductor multilayer film of a quantum well structure which generates a terahertz wave by transition of a career between subbands.

11. The oscillation device according to claim 1, wherein the antenna unit includes a first antenna and a second antenna,
the first connecting portion connects the waveguide structure and the first antenna, and
the second connecting portion connects the waveguide structure and the second antenna.

12. The oscillation device according to claim 11, further comprising a third connecting portion configured to connect the waveguide structure and the first antenna.

13. The oscillation device according to claim 1, wherein the waveguide structure has a linear shape.

14. The oscillation device according to claim 13, wherein, assuming that the oscillation wavelength of the electromagnetic wave is $\lambda_g$, a length of the waveguide structure in the resonance direction is an integer multiple of $\lambda_g/2$.

15. The oscillation device according to claim 1, wherein the waveguide structure has a half ring shape.

16. The oscillation device according to claim 15, wherein, assuming that the oscillation wavelength of the electromagnetic wave is $\lambda_g$, a length of the waveguide structure in the resonance direction is an integer multiple of $\lambda_g$.

17. The oscillation device according to claim 1, wherein the waveguide structure has a ring shape.

18. The oscillation device according to claim 17, wherein, assuming that the oscillation wavelength of the electromagnetic wave is $\lambda_g$, a length of the waveguide structure in the resonance direction is $2\lambda_g+n\lambda_g$ (n=0, 1, 2, ... ).

19. The oscillation device according to claim 1, wherein a frequency of the electromagnetic wave is equal to or higher than 30 GHz to lower than or equal to 30 THz.

20. A measurement apparatus for measuring an electromagnetic wave from a sample, the apparatus comprising:
an oscillator configured to irradiate the sample with the electromagnetic wave; and
a detector configured to detect the electromagnetic wave which has penetrated through the sample or reflected from the sample,
wherein the oscillator includes the oscillation device according to claim 1.

* * * * *